US012775349B2

(12) United States Patent
Saitoh et al.

(10) Patent No.: US 12,775,349 B2
(45) Date of Patent: Oct. 27, 2026

(54) TOUCH SENSOR, DISPLAY DEVICE, MANUFACTURING METHOD FOR TOUCH SENSOR, AND MANUFACTURING METHOD FOR DISPLAY DEVICE

(71) Applicant: Sharp Display Technology Corporation, Kameyama City (JP)

(72) Inventors: Takao Saitoh, Kameyama City (JP); Yohsuke Kanzaki, Kameyama City (JP); Masaki Yamanaka, Kameyama City (JP); Masahiko Miwa, Kameyama City (JP); Yi Sun, Kameyama City (JP); Masaki Fujiwara, Kameyama City (JP); Kouhei Kamatani, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 0 days.

(21) Appl. No.: 18/857,303

(22) PCT Filed: Jun. 8, 2022

(86) PCT No.: PCT/JP2022/023081
§ 371 (c)(1),
(2) Date: Oct. 16, 2024

(87) PCT Pub. No.: WO2023/238272
PCT Pub. Date: Dec. 14, 2023

(65) Prior Publication Data
US 2025/0258556 A1 Aug. 14, 2025

(51) Int. Cl.
*G06F 3/041* (2006.01)
*H10K 59/12* (2023.01)
(Continued)

(52) U.S. Cl.
CPC ....... *G06F 3/0412* (2013.01); *H10K 59/1201* (2023.02); *H10K 59/40* (2023.02); *H10K 59/873* (2023.02); *G06F 2203/04103* (2013.01)

(58) Field of Classification Search
None
See application file for complete search history.

(56) References Cited

U.S. PATENT DOCUMENTS 11,005,068 B1 * 5/2021 Ye ........................ H10K 59/879
2013/0285079 A1 10/2013 Hayashi et al.
(Continued)

FOREIGN PATENT DOCUMENTS

JP H07253593 A 10/1995
JP 2013242517 A 12/2013

*Primary Examiner* — Brian M Butcher
(74) *Attorney, Agent, or Firm* — ScienBiziP, P.C.

(57) ABSTRACT

A touch sensor includes a first insulating layer, a first wiring line located above the first insulating layer, and a second insulating layer located above the first wiring line. An opening extending through the first insulating layer and the second insulating layer is formed. The first insulating layer includes a first edge corresponding to an edge of the opening. The second insulating layer includes a second edge corresponding to an edge of the opening. A film thickness of the first edge is thinner than a film thickness of a portion other than the first edge in the first insulating layer, or a film thickness of the second edge is thinner than a film thickness of a portion other than the second edge in the second insulating layer.

8 Claims, 8 Drawing Sheets

(51) Int. Cl.
*H10K 59/40* (2023.01)
*H10K 59/80* (2023.01)

(56) References Cited

U.S. PATENT DOCUMENTS

| | | | |
|---|---|---|---|
| 2015/0216041 | A1 | 7/2015 | Hayashi et al. |
| 2021/0126221 | A1 | 4/2021 | Ye |

* cited by examiner

TOUCH SENSOR, DISPLAY DEVICE, MANUFACTURING METHOD FOR TOUCH SENSOR, AND MANUFACTURING METHOD FOR DISPLAY DEVICE

TECHNICAL FIELD

The disclosure relates to a touch sensor, a display device, a manufacturing method for the touch sensor, and a manufacturing method for the display device.

BACKGROUND ART

PTL 1 discloses a manufacturing method for a liquid crystal display device in which etching processing is performed a plurality of times on at least a part of a pattern on the same layering plane parallel to a substrate.

CITATION LIST

Patent Literature

PTL 1: JP 7-253593 A (published on Oct. 3, 1995)

SUMMARY

Technical Problem

In the related art, there is a problem that the film thickness of the insulating layer at the position where the opening of the touch sensor is formed is large.

In a structure in which an opening is provided in an insulating layer having a large film thickness, the etching time for etching the insulating layer is long. When the etching time is long, the temperature of a display panel located below the touch sensor increases. The temperature rise reduces the performance of the display panel. In particular, when the display panel is a light-emitting display panel including a light-emitting element, the characteristics of the light-emitting element are degraded. The light-emitting element is an OLED including an organic light-emitting material or a QLED including light-emitting quantum dots.

Solution to Problem

According to an aspect of the disclosure, there is provided a touch sensor including: a first insulating layer; a first wiring line located above the first insulating layer; and a second insulating layer located above the first wiring line, wherein an opening extending through the first insulating layer and the second insulating layer is formed, the first insulating layer includes a first edge corresponding to an edge of the opening, the second insulating layer includes a second edge corresponding to an edge of the opening, and a film thickness of the first edge is thinner than a film thickness of a portion other than the first edge in the first insulating layer, or a film thickness of the second edge is thinner than a film thickness of a portion other than the second edge in the second insulating layer.

According to an aspect of the disclosure, there is provided a manufacturing method for a touch sensor including a first insulating layer, a first wiring line located above the first insulating layer, a second insulating layer located above the first wiring line, and a second wiring line located above the second insulating layer, the manufacturing method including: performing at least one of forming a first thin film portion in the first insulating layer by dry-etching the first insulating layer in a state where the first wiring line is covered with a first resist, and forming a second thin film portion in the second insulating layer by dry-etching the second insulating layer in a state where the second wiring line is covered with a second resist.

Advantageous Effects of Disclosure

According to an aspect of the disclosure, the film thickness of the insulating layer at the position where the opening of the touch sensor is formed can be reduced. Therefore, performance deterioration of the display panel located below the touch sensor is reduced.

DESCRIPTION OF EMBODIMENTS

First Embodiment

Planar Configuration

Figure 1:
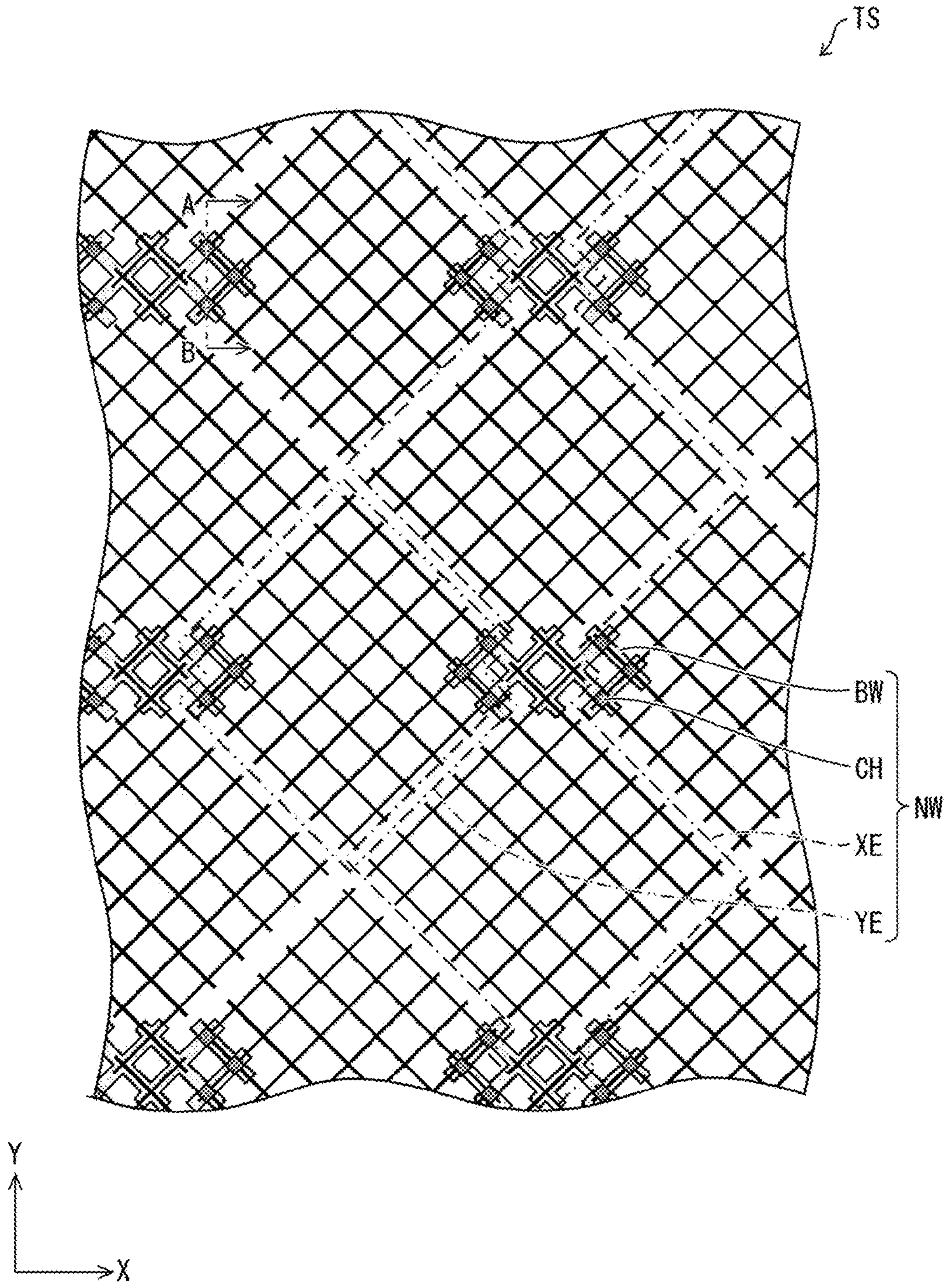
FIG. 1 is a plan view illustrating a configuration example of a touch sensor according to an embodiment of the disclosure.

FIG. 1 is a plan view illustrating a configuration example of a touch sensor according to an embodiment of the disclosure. As illustrated in FIG. 1, a touch sensor TS includes a net-like wiring line NW through which light can pass. The net-like wiring line includes an X electrode XE, a Y electrode YE, a bridge wiring line BW, and a contact hole CH.

The X electrodes XE extend in a Y direction and are provided in a plurality of rows in an X direction. The Y electrodes YE are formed in the same layer as the X electrodes XE, are connected to the Y electrodes YE adjacent thereto in the X direction via the bridge wiring lines BW, and are provided in a plurality of stages in the Y direction. The bridge wiring line BW is formed in a different layer from the X electrode XE and the Y electrode YE, three dimensionally crosses the X electrode XE, and is connected to the Y electrode YE through the contact hole CH.

Cross-Sectional Configuration

Figure 2:
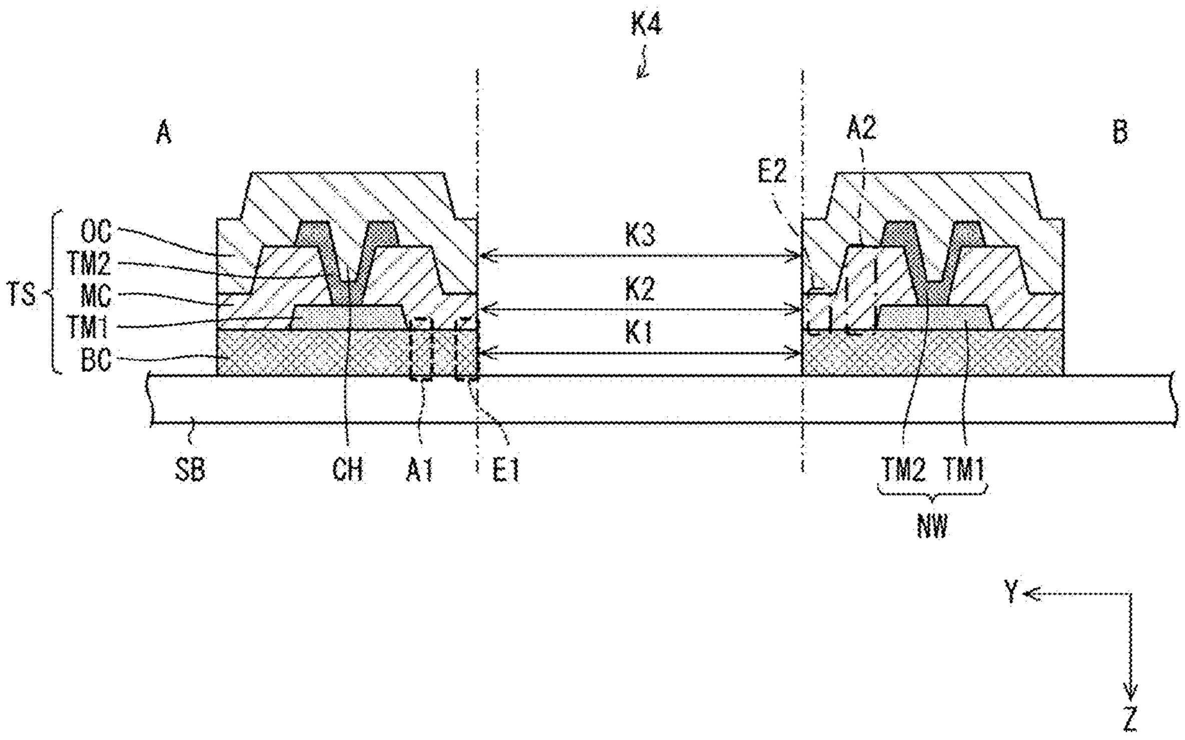
FIG. 2 is a cross-sectional view illustrating a configuration example of the touch sensor according to the embodiment of the disclosure.

FIG. 2 is a cross-sectional view illustrating a configuration example of the touch sensor according to the present embodiment and corresponds to a cross-sectional view taken along A-B of FIG. 1. As illustrated in FIG. 2, the touch sensor TS is formed on a support body SB, and includes a base coat layer BC (first insulating layer), a first wiring line TM1, an intermediate coat layer MC (second insulating layer), a second wiring line TM2, and an overcoat layer OC (third insulating layer) in this order from a layer below to a layer above (from the bottom to the top in FIG. 2).

The base coat layer BC includes a first opening K1 and a first edge E1 surrounding the first opening. The intermediate coat layer MC covers the first wiring line TM1. The intermediate coat layer MC includes a second opening K2 and a second edge E2 surrounding the second opening. In the base coat layer BC according to the present embodiment, the film thickness of the first edge E1 is almost as thick as the film thickness of a portion other than the first edge E1. The portion other than the first edge E1 of the base coat layer BC includes a first adjacent portion A1 adjacent to the first wiring line TM1 in a plan view seen from a Z direction. In short, the first edge E1 is as thick as the first adjacent portion A1. On the other hand, in the intermediate coat layer MC, the film thickness of the second edge E2 is thinner than the film thickness of a portion other than the second edge E2. The portion other than the second edge E2 of the intermediate coat layer MC includes a second adjacent portion A2 adjacent to the first wiring line TM1 in a plan view seen from the Z direction. In short, the second edge E2 is thinner than the second adjacent portion A2.

Each of the first wiring line TM1 and the second wiring line TM2 is a part of the net-like wiring line NW. The bridge wiring line BW is formed from the first wiring line TM1, and the X electrode XE and the Y electrode YE are formed from the second wiring line TM2. The bridge wiring line BW and the X electrode XE are insulated from each other by the intermediate coat layer MC. The bridge wiring line BW and the Y electrode YE are connected to each other by the contact hole CH extending through the intermediate coat layer MC. The intermediate coat layer MC is preferably thick, and to be specific, the second adjacent portion A2 of the intermediate coat layer MC is preferably thicker than the first adjacent portion A1 of the base coat layer BC.

Each of the first opening K1, the second opening K2, and a third opening K3 is located in a mesh of the net-like wiring line NW, and functions as a light extraction portion that extracts light from below the touch sensor TS to above the touch sensor TS (or vice versa). Preferably, the first opening K1, the second opening K2, and the third opening K3 are aligned with each other to form one opening K4 where the support body SB is exposed at the bottom surface. The first edge E1 and the second edge E2 correspond to the edges of the opening K4.

Each of the base coat layer BC, the intermediate coat layer MC, and the overcoat layer OC is an inorganic insulating film. The inorganic insulating film may contain, for example, any one or more of silicon oxide, silicon nitride, and silicon oxynitride. Each of the first wiring line TM1 and the second wiring line TM2 is a conductive film and is formed of, for example, a metal layer. No metal layer is formed above (upper side in FIG. 2) the overcoat layer OC.

Manufacturing Method

Figure 3:
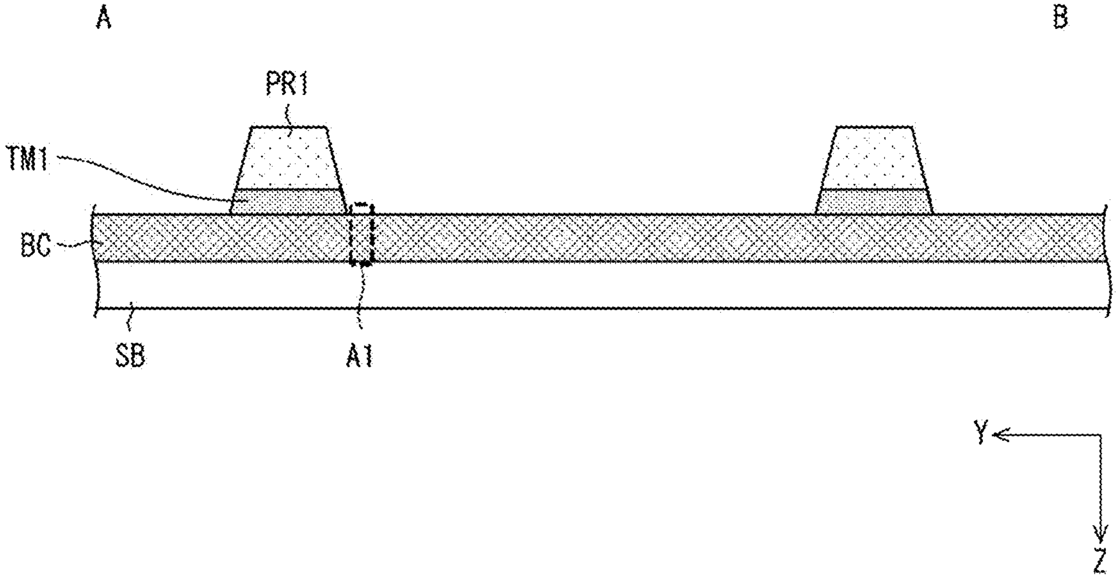
FIG. 3 is a cross-sectional view illustrating an example of a manufacturing method for the touch sensor according to the embodiment of the disclosure.

Each of FIGS. 3 to 7 is a cross-sectional view illustrating an example of a manufacturing method for the touch sensor according to the present embodiment. As illustrated in FIG. 3, first, the base coat layer BC covering the support body SB is formed, a metal film is formed on the base coat layer BC, and a photoresist PR1 is formed on the metal film. Then, the photoresist PR1 is patterned using a photolithography technique, and the metal film is patterned by dry etching using the photoresist PR1 as a mask. As a result, the first wiring line TM1 is formed.

Figure 4:
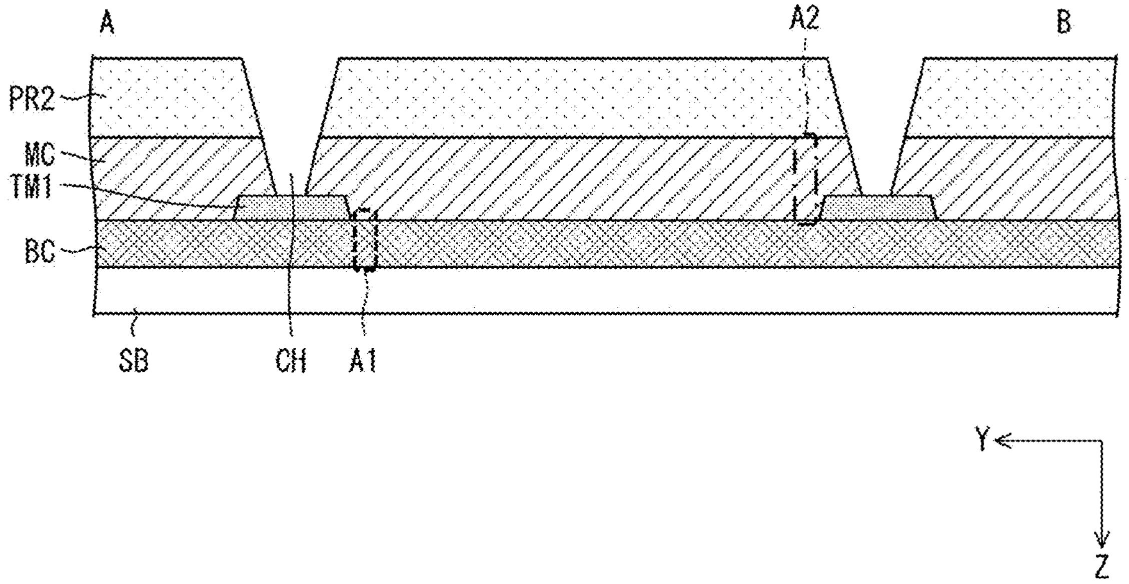
FIG. 4 is a cross-sectional view illustrating an example of the manufacturing method for the touch sensor according to the embodiment of the disclosure.

Next, as illustrated in FIG. 4, the intermediate coat layer MC covering the base coat layer BC and the first wiring line TM1 is formed, and a photoresist PR2 is formed on the intermediate coat layer MC. Then, the photoresist PR2 is patterned, and the contact hole CH is formed in the intermediate coat layer MC using the photoresist PR2 as a mask. Then, the photoresist PR2 is removed.

Figure 5:
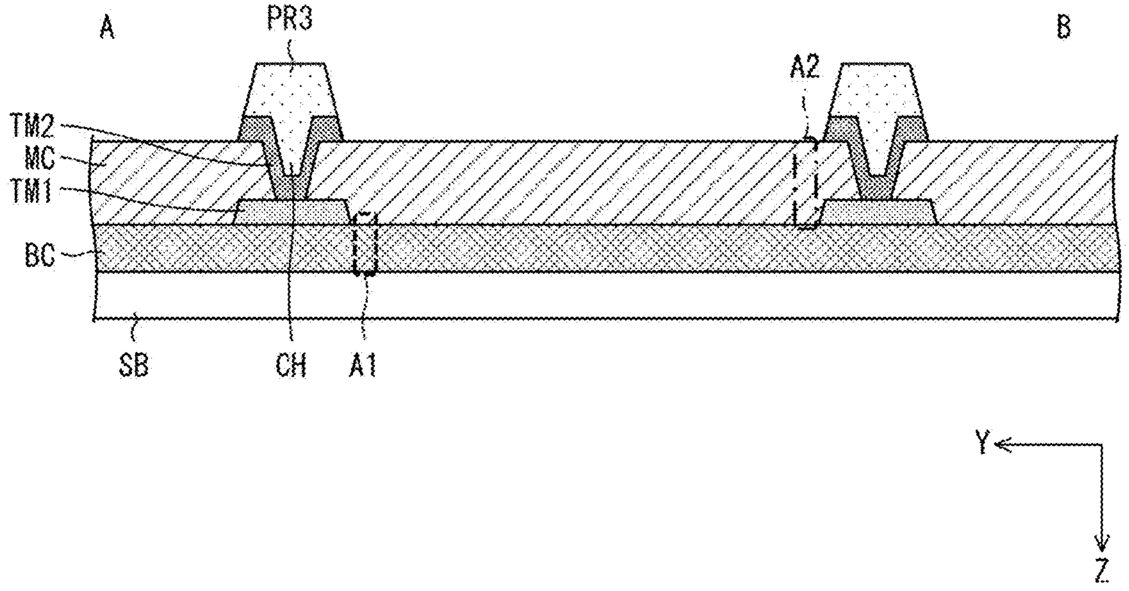
FIG. 5 is a cross-sectional view illustrating an example of the manufacturing method for the touch sensor according to the embodiment of the disclosure.

Next, as illustrated in FIG. 5, a metal film is formed on the intermediate coat layer MC, and a photoresist PR3 is formed on the metal film. Then, the photoresist PR3 is patterned, and the metal film is patterned using the photoresist PR3 as a mask. As a result, the second wiring line TM2 is formed. Then, the photoresist PR3 is removed.

Figure 6:
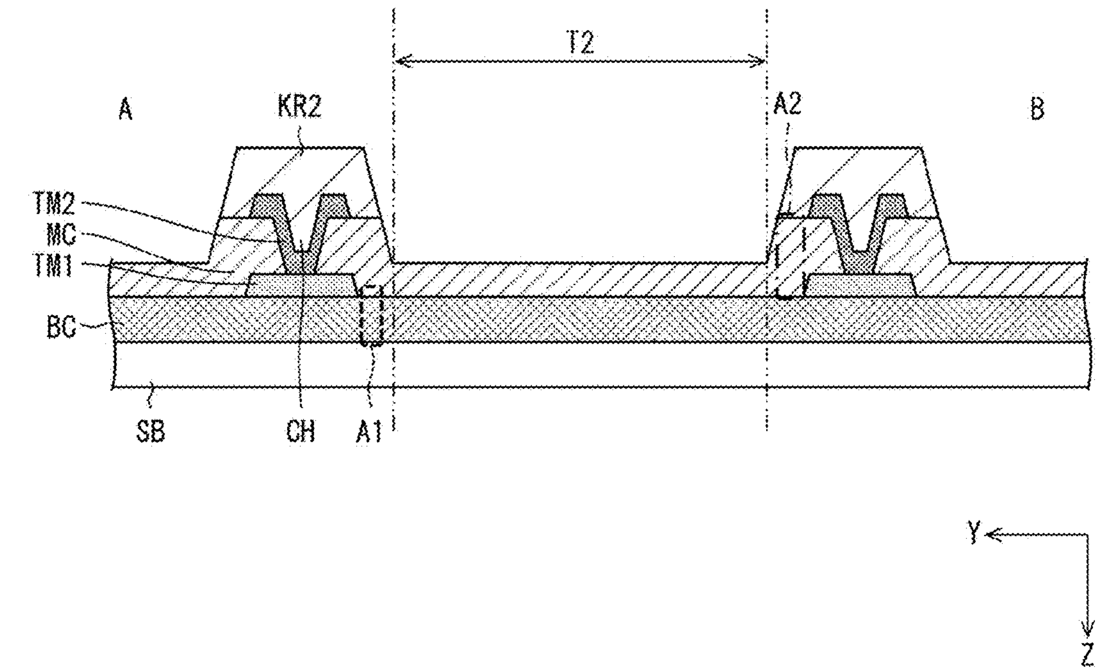
FIG. 6 is a cross-sectional view illustrating an example of the manufacturing method for the touch sensor according to the embodiment of the disclosure.

Next, as illustrated in FIG. 6, a photoresist KR2 (second resist) covering the intermediate coat layer MC and the second wiring line TM2 is formed and patterned. Here, the photoresist KR2 is patterned to cover and protect at least the second adjacent portion A2 with respect to the intermediate coat layer MC. In addition, the photoresist KR2 can cover an overlapping portion overlapping with the first wiring line TM1, an overlapping portion overlapping with the second wiring line TM2, and an adjacent portion adjacent to the second wiring line TM2 in a plan view. A portion of the intermediate coat layer MC not overlapping with nor adjacent to the first wiring line TM1 and the second wiring line TM2 is not covered with the photoresist KR2. Then, the intermediate coat layer MC is dry-etched using the photoresist KR2 as a mask. As a result, the film thickness of a portion of the intermediate coat layer MC which is not covered with the photoresist KR2 is reduced, and a thin film portion T2 (second thin film portion) is formed in the intermediate coat layer MC. The metal film and the residue remaining on the portion of the intermediate coat layer MC not covered with the photoresist KR2 are removed. The second adjacent portion A2 of the intermediate coat layer MC remains and covers and protects the side surface of the first wiring line TM1. Then, the photoresist KR2 is removed.

Figure 7:
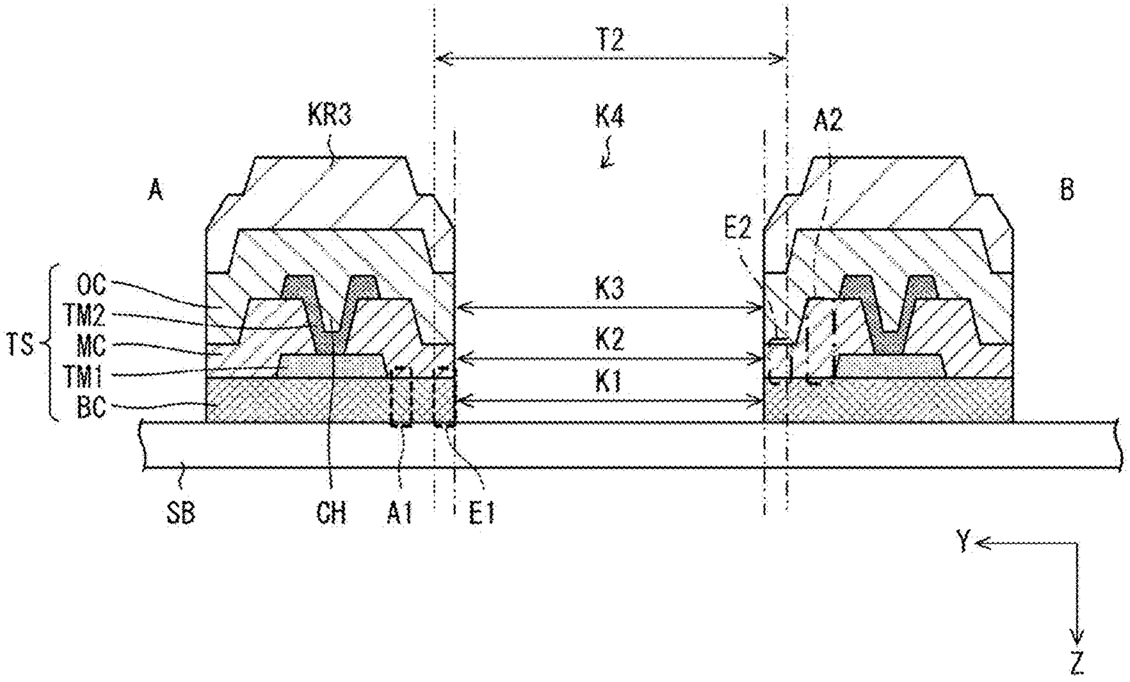
FIG. 7 is a cross-sectional view illustrating an example of the manufacturing method for the touch sensor according to the embodiment of the disclosure.

Next, as illustrated in FIG. 7, the overcoat layer OC covering the intermediate coat layer MC and the second wiring line TM2 is formed, and a photoresist KR3 (third resist) is formed on the overcoat layer OC. Then, the photoresist KR3 is patterned, and using the photoresist KR3 as a mask, the third opening K3 is formed in the overcoat layer OC, the second opening K2 is formed in the intermediate coat layer MC, and the first opening K1 is formed in the base coat layer BC. Here, the second opening K2 is formed in the thin film portion T2 of the intermediate coat layer MC. In short, the opening K4 extending through the overcoat layer OC, the thin film portion T2 of the intermediate coat layer MC, and the base coat layer BC is formed. Then, the photoresist KR3 is removed.

As a result, the configuration example of the touch sensor TS illustrated in FIG. 2 is formed.

Action and Effects

In the related art, the total thickness of the base coat layer BC, the intermediate coat layer MC, and the overcoat layer OC at the position where the opening K4 is formed is 1 μm or more, which is a problem. As the thickness of the film to be etched increases, the etching time becomes longer, and the temperature of the touch sensor TS and the support body SB below the touch sensor TS is likely to increase. In addition, variation in the depth to be excavated by etching (so-called "excavated amount") is likely to increase.

On the other hand, according to the present embodiment, since the thin film portion T2 is formed in the intermediate coat layer MC and the second opening K2 is formed in the thin film portion T2, the thickness of the film to be etched when the opening K4 is formed is smaller than that in the related art. Therefore, the effect of reducing the temperature rise and the effect of reducing the variation in the excavated amount are achieved. Further, by removing the unnecessary metal film and residue remaining on the intermediate coat layer MC, it is possible to prevent an electrical short circuit of the second wiring line TM2.

Second Embodiment

Another embodiment of the disclosure will be described below. Further, members having the same functions as those of the members described in the above-described embodiments will be denoted by the same reference numerals and signs, and the description thereof will not be repeated for the sake of convenience of description.

Figure 8:
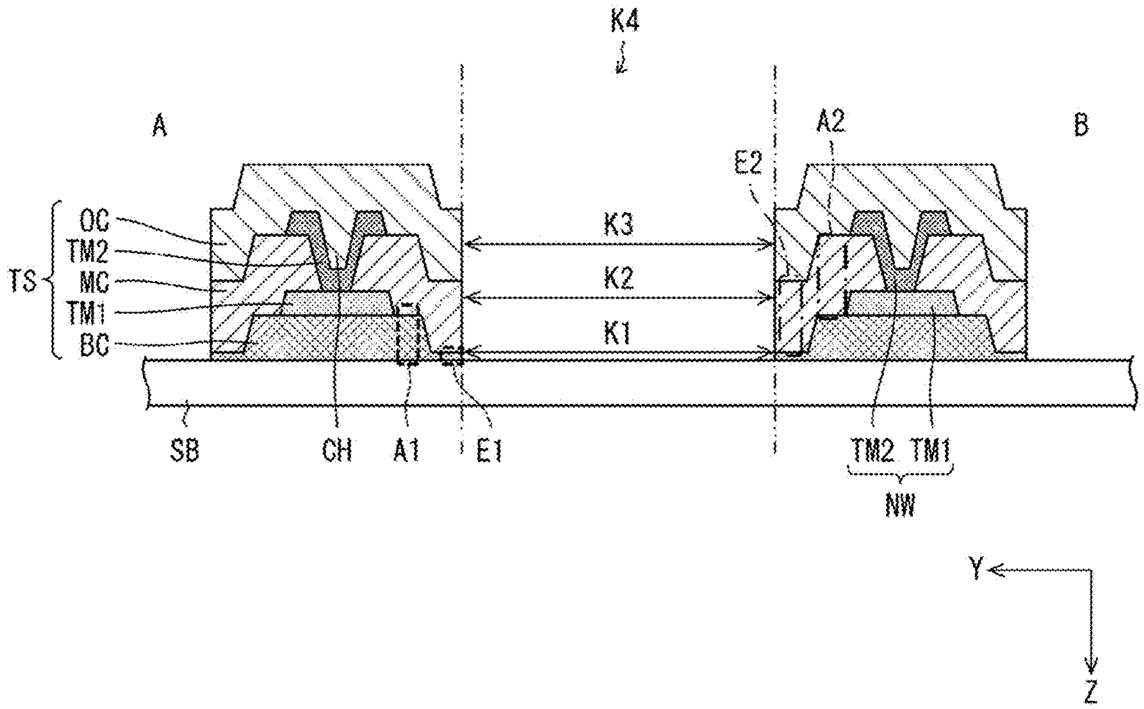
FIG. 8 is a cross-sectional view illustrating a configuration example of a touch sensor according to an embodiment of the disclosure.

FIG. 8 is a cross-sectional view illustrating a configuration example of a touch sensor according to the present embodiment and corresponds to the cross-sectional view taken along A-B of FIG. 1. As illustrated in FIG. 8, in the base coat layer BC according to the present embodiment, the film thickness of the first edge E1 is thinner than the film thickness of a portion other than the first edge E1. On the other hand, in the intermediate coat layer MC, the film thickness of the second edge E2 is almost as thick as the film thickness of a portion other than the second edge E2.

Each of FIGS. 9 to 12 is a cross-sectional view illustrating an example of a manufacturing method for the touch sensor according to the present embodiment. Referring to FIG. 3 again, the base coat layer BC and the first wiring line TM1 are first formed in the same manner as in the first embodiment above.

Figure 9:
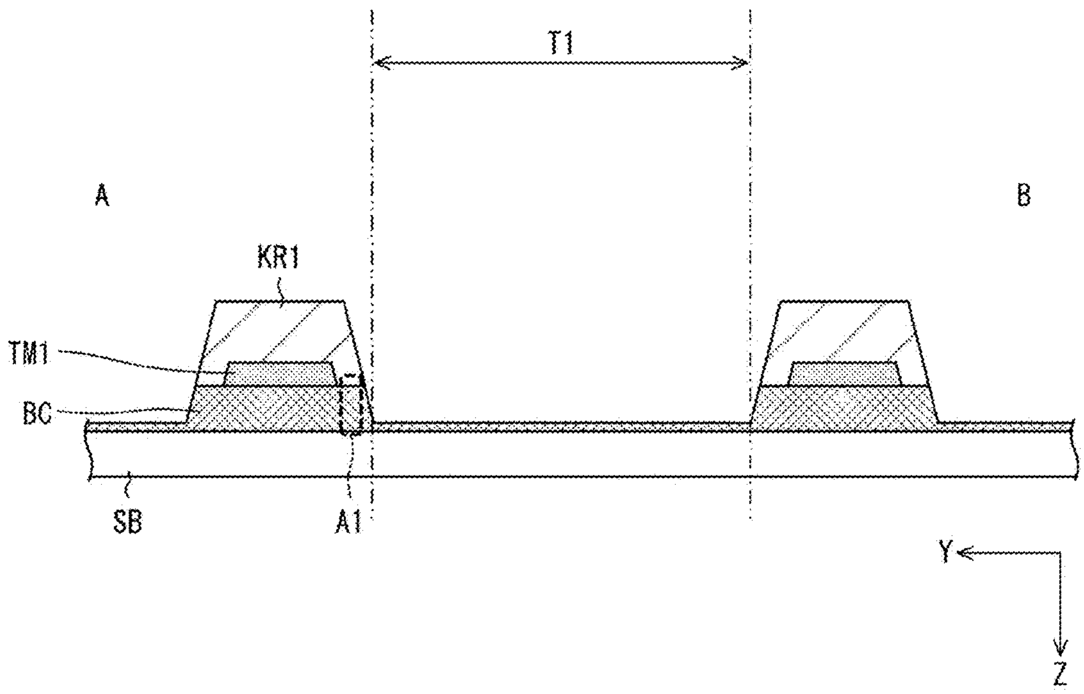
FIG. 9 is a cross-sectional view illustrating an example of a manufacturing method for the touch sensor according to the embodiment of the disclosure.

Next, as illustrated in FIG. 9, the photoresist KR1 (first resist) covering the base coat layer BC and the first wiring line TM1 is formed and patterned. Here, the photoresist KR1 is patterned to cover and protect at least the first adjacent portion A1 with respect to the base coat layer BC. In addition, the photoresist KR1 can cover an overlapping portion overlapping with the first wiring line TM1 in a plan view. A portion of the base coat layer BC not overlapping with nor adjacent to the first wiring line TM1 is not covered with the photoresist KR1. Then, the base coat layer BC is dry-etched using the photoresist KR1 as a mask. As a result, the film thickness of a portion of the base coat layer BC which is not covered with the photoresist KR1 is reduced, and the thin film portion T1 (first thin film portion) is formed in the base coat layer BC. Then, the photoresist KR1 is removed.

Figure 10:
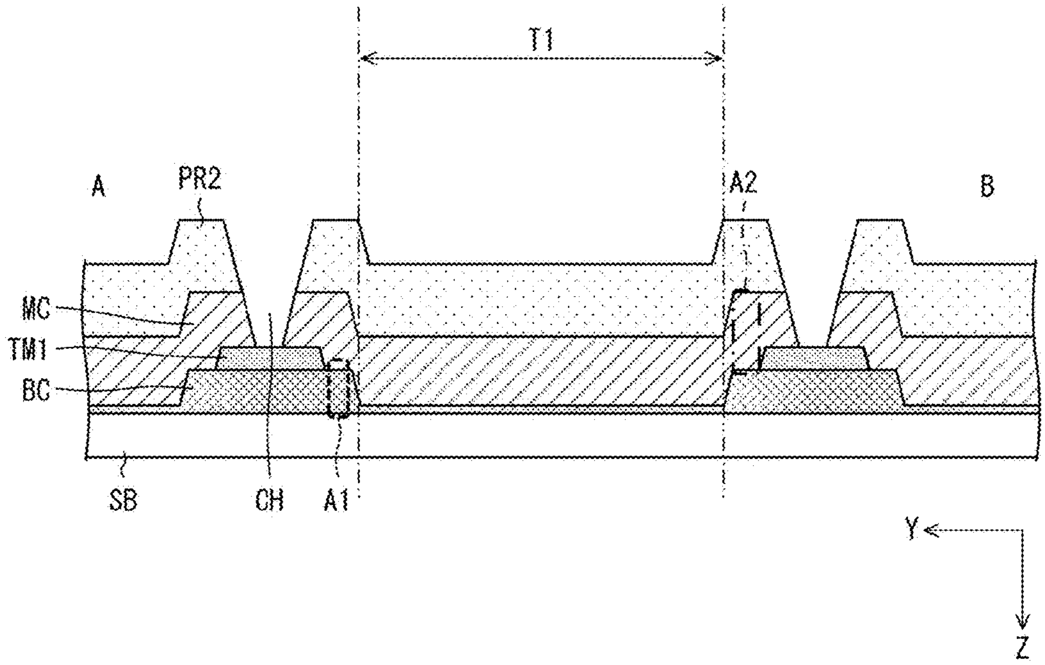
FIG. 10 is a cross-sectional view illustrating an example of the manufacturing method for the touch sensor according to the embodiment of the disclosure.

Next, as illustrated in FIG. 10, the intermediate coat layer MC is formed, the photoresist PR2 is formed and patterned, and the contact hole CH is formed in the intermediate coat layer MC. Then, the photoresist PR2 is removed.

Figure 11:
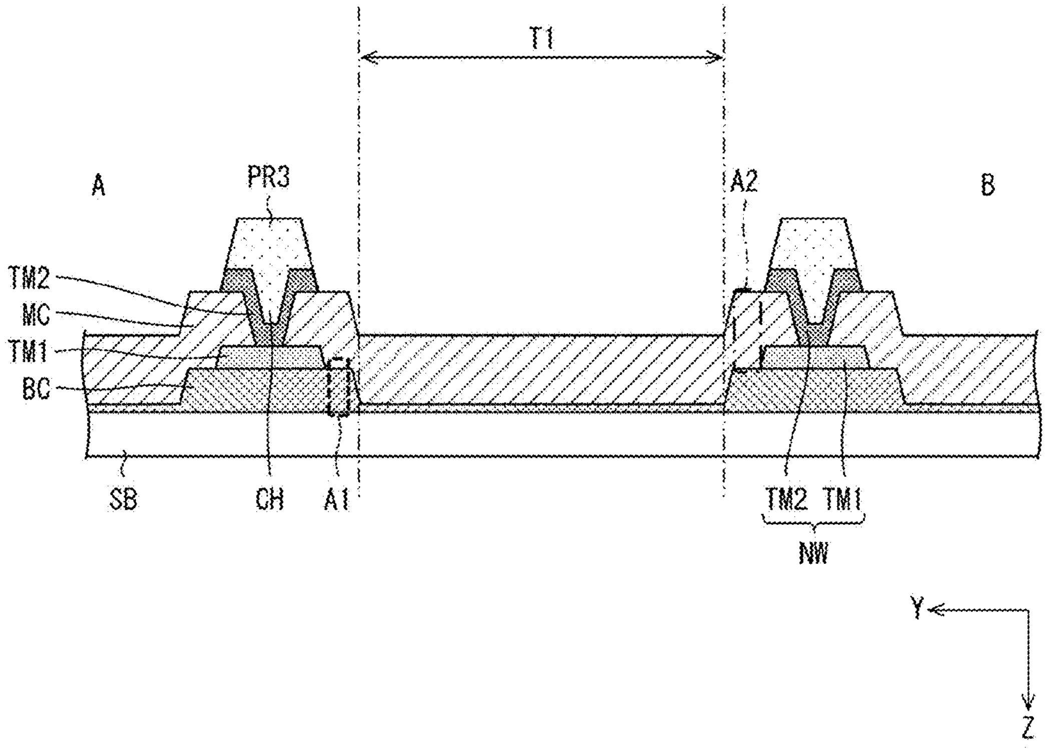
FIG. 11 is a cross-sectional view illustrating an example of the manufacturing method for the touch sensor according to the embodiment of the disclosure.

Next, as illustrated in FIG. 11, a metal film is formed, the photoresist PR3 is formed and patterned, and the second wiring line TM2 is formed. Then, the photoresist PR3 is removed.

Figure 12:
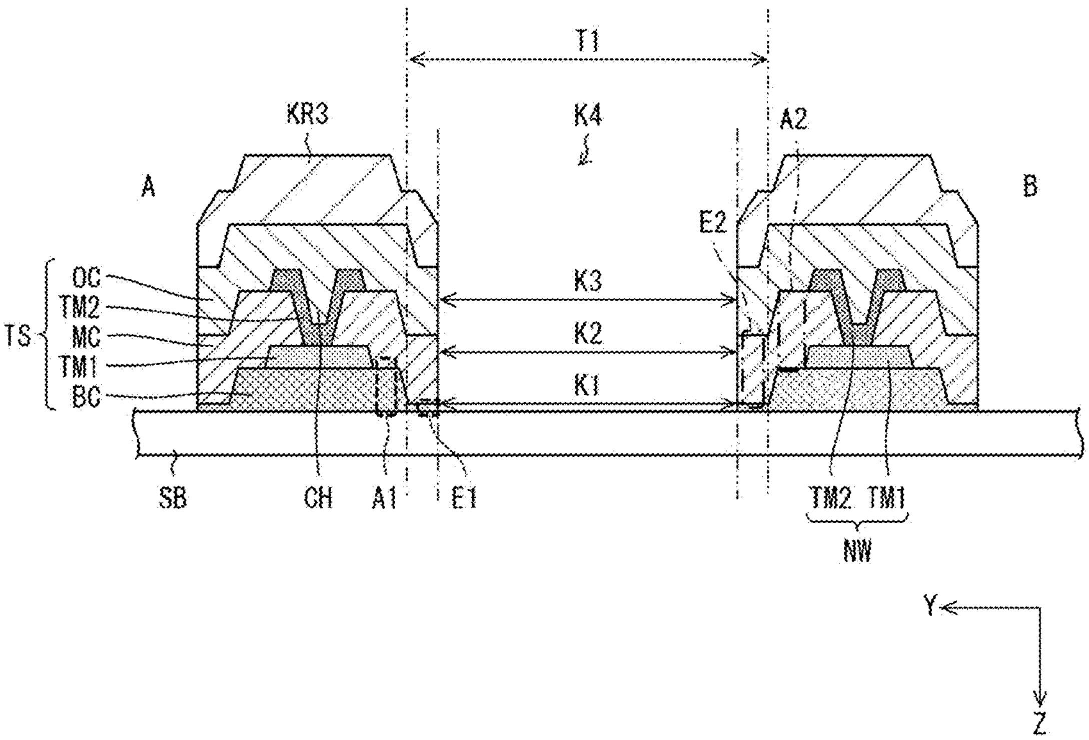
FIG. 12 is a cross-sectional view illustrating an example of the manufacturing method for the touch sensor according to the embodiment of the disclosure.

Next, as illustrated in FIG. 12, the overcoat layer OC is formed, the photoresist KR3 is formed and patterned, the third opening K3 is formed in overcoat layer OC, the second opening K2 is formed in intermediate coat layer MC, and the first opening K1 is formed in base coat layer BC. Here, the first opening K1 is formed in the thin film portion T1 of the base coat layer BC. In short, the opening K4 extending through the overcoat layer OC, the intermediate coat layer MC, and the thin film portion T1 of the base coat layer BC is formed. Then, the photoresist KR3 is removed.

As a result, the configuration example of the touch sensor TS illustrated in FIG. 8 is formed.

Action and Effects

According to the present embodiment, as in the first embodiment described above, the effect of reducing the temperature rise and the effect of reducing the variation in the excavated amount are achieved. Further, it is possible to prevent an electrical short circuit of the first wiring line TM1.

Third Embodiment

Another embodiment of the disclosure will be described below.

Figure 13:
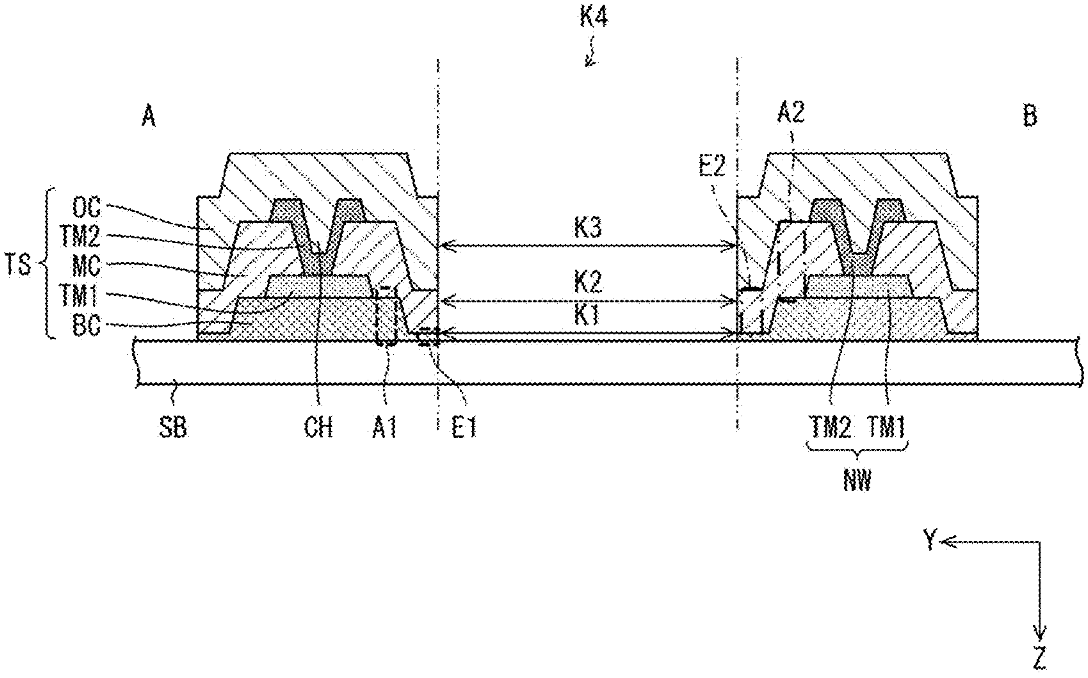
FIG. 13 is a cross-sectional view illustrating a configuration example of a touch sensor according to an embodiment of the disclosure.

FIG. 13 is a cross-sectional view illustrating a configuration example of a touch sensor according to the present embodiment and corresponds to the cross-sectional view taken along A-B of FIG. 1. As illustrated in FIG. 13, in the base coat layer BC according to the present embodiment, the film thickness of the first edge E1 is thinner than the film thickness of a portion other than the first edge E1. In addition, in the intermediate coat layer MC, the film thickness of the second edge E2 is thinner than the film thickness of a portion other than the second edge E2.

Since the manufacturing method for the touch sensor according to the present embodiment is apparent from the manufacturing method for the touch sensors according to the first and second embodiments described above, description thereof will be omitted.

Fourth Embodiment

Another embodiment of the disclosure will be described below.

Figure 14:
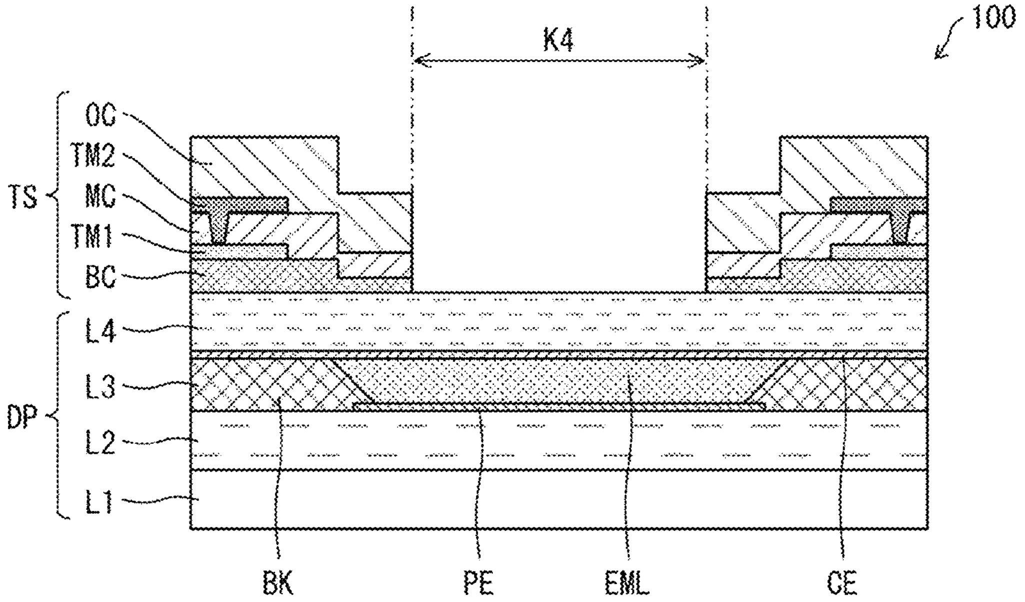
FIG. 14 is a cross-sectional view illustrating a configuration example of a display device according to an embodiment of the disclosure.

FIG. 14 is a cross-sectional view illustrating a configuration example of a display device according to the present embodiment. As illustrated in FIG. 14, a display device 100 includes a display panel DP and a touch sensor TS on the display panel DP. The touch sensor TS included in the display device 100 may have the configuration according to any one of the first to third embodiments described above.

As an example, the display panel DP may include a support substrate L1, a circuit layer L2 located above the support substrate L1 and including pixel circuits, a light-emitting element layer L3 located above the circuit layer L2 and including light-emitting elements, and a sealing layer L4 located above the light-emitting element layer L3. The light-emitting element layer L3 includes a pixel electrode PE, a bank BK covering edges of the pixel electrode, a common electrode CE opposed to the pixel electrode PE, and a light-emitting layer EML located between the pixel electrode PE and the common electrode CE. The base coat layer BC may be formed on the sealing layer L4.

The effect of reducing the temperature rise described above is particularly beneficial when the display panel DP is an OLED panel including an organic light-emitting material in the light-emitting layer EML or a QLED panel including light-emitting quantum dots in the light-emitting layer EML, and the base coat layer BC is formed directly on the sealing layer L4. By reducing the temperature rise, the characteristics of the light-emitting elements in the display panel DP below the touch sensor TS are prevented from deteriorating. This is because an OLED including an organic light-emitting material and a QLED including light-emitting quantum dots are deteriorated in light-emitting characteristics due to heat. Note that the display panel DP is not limited thereto, and may be, for example, a liquid crystal display panel.

The arrangement of the light-emitting regions in the light-emitting layer EML preferably corresponds to the arrangement of the openings in the touch sensor TS. Specifically, the pixel electrode PE is preferably aligned with the first opening K1, the second opening K2, and the third opening K3.

The manufacturing method for the display device according to the present embodiment includes preparing the display panel DP and forming the touch sensor TS by using the manufacturing method for the touch sensor TS according to any one of the first to third embodiments described above. The touch sensor TS may be monolithically formed on the display panel DP. "Monolithically formed" means, specifically, that the base coat layer BC is formed directly on the sealing layer L4.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A touch sensor comprising:

a first insulating layer;

a first wiring line located above the first insulating layer;

a second insulating layer located above the first wiring line;

a second wiring line located above the second insulating layer; and a third insulating layer covering the second wiring line, wherein:

an opening extending through the first insulating layer, the second insulating layer, and the third insulating layer is formed, the first insulating layer includes a first edge corresponding to an edge of the opening, the second insulating layer includes a second edge corresponding to the edge of the opening, and a film thickness of the first edge is thinner than a film thickness of a portion other than the first edge in the first insulating layer, or a film thickness of the second edge is thinner than a film thickness of a portion other than the second edge in the second insulating layer.

2. The touch sensor according to claim 1, wherein the second wiring line is a part of a net-like wiring line.

3. The touch sensor according to claim 2, wherein the opening is located in a mesh of the net-like wiring line in a plan view and functions as a light extraction portion.

4. The touch sensor according to claim 1, wherein each of the first insulating layer and the second insulating layer is an inorganic insulating layer.

5. The touch sensor according to claim 1, wherein a contact hole connecting the first wiring line and the second wiring line is formed in the second insulating layer.

6. The touch sensor according to claim 1, wherein no metal layer is formed above the third insulating layer.

7. A display device comprising the touch sensor according to claim 1.

8. The display device according to claim 7, further comprising:

a light-emitting element layer; and a sealing layer located above the light-emitting element layer, wherein the first insulating layer is formed on the sealing layer.

* * * * *